(12) United States Patent
Yen

(10) Patent No.: US 6,947,304 B1
(45) Date of Patent: Sep. 20, 2005

(54) DDR MEMORY MODULES WITH INPUT BUFFERS DRIVING SPLIT TRACES WITH TRACE-IMPEDANCE MATCHING AT TRACE JUNCTIONS

(75) Inventor: Yao Tung Yen, Cupertino, CA (US)

(73) Assignee: Pericon Semiconductor Corp., San Jose, CA (US)

( * ) Notice: Subject to any disclaimer, the term of this patent is extended or adjusted under 35 U.S.C. 154(b) by 208 days.

(21) Appl. No.: 10/249,845

(22) Filed: May 12, 2003

(51) Int. Cl.⁷ .................................................. G11C 5/06
(52) U.S. Cl. ..................... 365/63; 365/51; 365/189.05
(58) Field of Search ........................ 365/63, 51, 189.05, 365/185.27, 52, 233, 129

(56) References Cited

U.S. PATENT DOCUMENTS

| | | | |
|---|---|---|---|
| 5,260,892 A | 11/1993 | Testa | 365/63 |
| 5,426,405 A | 6/1995 | Miller et al. | 333/247 |
| 5,532,954 A | 7/1996 | Bechtolsheim et al. | 365/52 |
| 6,061,263 A | 5/2000 | Boaz et al. | 365/51 |
| 6,067,594 A | 5/2000 | Perino et al. | 710/301 |
| 6,104,629 A | 8/2000 | Wu | 365/63 |
| 6,125,419 A * | 9/2000 | Umemura et al. | 710/110 |
| 6,236,572 B1 | 5/2001 | Teshome et al. | 361/794 |
| 6,449,166 B1 | 9/2002 | Sly et al. | 361/760 |
| 6,484,299 B1 | 11/2002 | Larsen | 716/6 |
| 6,487,086 B2 | 11/2002 | Ikeda | 361/772 |
| 6,515,555 B2 | 2/2003 | Leddige et al. | 333/34 |
| 6,542,393 B1 | 4/2003 | Chu et al. | 365/51 |
| 6,714,433 B2 * | 3/2004 | Doblar et al. | 365/63 |

* cited by examiner

Primary Examiner—Richard Elms
Assistant Examiner—Dang Nguyen
(74) Attorney, Agent, or Firm—Stuart T. Auvinen

(57) ABSTRACT

A memory module has improved signal propagation delays for signals externally driven such as from a motherboard. Reflections from junctions of wiring traces on the memory module are reduced or eliminated. An input buffer or register receives a signal from the motherboard and splits the signal to drive two outputs to two separate traces. Each trace is enlarged in width or thickness, such as by using a double-width wiring trace. At the fare end of each double-width trace, a junction is made to two minimum-width traces that connect to small stub traces to DRAM inputs. Reflections from the junction are eliminated or reduced by trace-impedance matching, since the input impedance of the double-width trace from the input buffer is about the same as the combined impedance of the two minimum-width traces. Trace-input matching and input buffering can improve signal integrity and overall propagation delay.

20 Claims, 6 Drawing Sheets

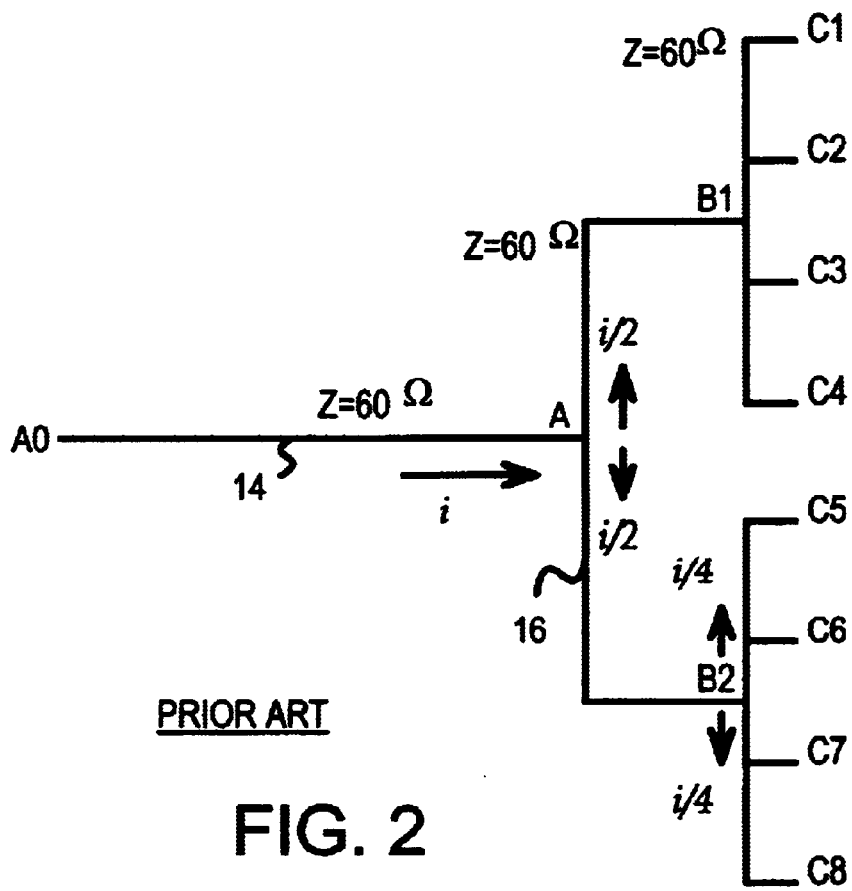
PRIOR ART
FIG. 2
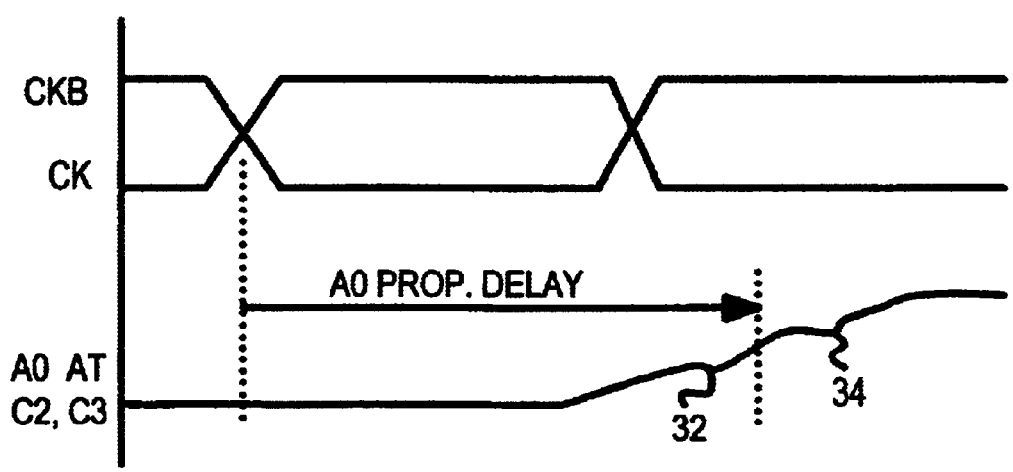
PRIOR ART    FIG. 3

DDR MEMORY MODULES WITH INPUT BUFFERS DRIVING SPLIT TRACES WITH TRACE-IMPEDANCE MATCHING AT TRACE JUNCTIONS

BACKGROUND OF INVENTION

This invention relates to memory modules, and more particularly to buffering signals on memory modules.

Memory modules such as dual-inline memory modules (DIMMs) are widely used in electronic systems such as personal computers (PCs). Memory modules have memory chips such as dynamic-random-access memories (DRAMs) mounted on a small substrate such as a printed-circuit board (PCB). Contact pads are formed along one edge of the substrate to make electrical contact when the memory module is plugged into a socket such as on a PC motherboard.

As these electronic systems operate at higher and higher speeds, signals driven to the memory modules must also operate at higher frequencies. Faster high-current drivers can be used to more rapidly drive current to charge and discharge the capacitances on the inputs of DRAM chips on the memory modules. These DRAM-input capacitances can be significant, producing a large capacitive load on the inputs to the memory modules, especially when many DRAM chips are mounted on the same memory module.

Further compounding the input-capacitance problem is the use of expansion memory. A PC motherboard may contain several memory-module sockets such as 2 or 4. Initially, only one socket may be populated with a memory module, but later the end-user may insert additional memory modules into the unused memory-module sockets to expand the memory capacity. Input capacitance can double or quadruple when the end-user installs additional memory.

FIG. 1 shows a signal trace on a typical memory module. Chip set 10 on a PC motherboard includes driver 12 that drives line 14. Line 14 is the address line A0, but could be other address or control lines generated by a memory controller. Line 14 is routed from chip set 10 along wiring traces on the multi-layer PC motherboard to one or more memory module sockets, including a socket containing DIMM 20.

Contact pads along an edge of DIMM 20 make electrical contact with metal tabs inside the memory module socket. One of the contact pads connects line 14 on the PC motherboard to line 16 on DIMM 20. Line 16 is a wiring trace on or within the memory module substrate of DIMM 20.

DIMM 20 contains eight DRAM chips 21–28. DRAM chips 21–28 can be synchronous DRAMs (SDRAMs) that receive a clock as one of the control lines. Some DIMM modules may have fewer or more DRAM chips than the 8 shown in this example.

The A0 address signal must be routed to inputs of all 8 DRAM chips 21–28. Line 16 is initially one trace, but then branches into two branches at junction A. One branch continues to junction B1, where it again splits, ultimately to four branches C1, C2, C3, C4 that connect to inputs of DRAM chips 21–24. The lower branch continues to junction B2, where it again splits, ultimately to four more branches C5, C6, C7, C8 that connect to inputs of DRAM chips 25–28.

FIG. 2 highlights a reflection problem caused by trace junctions. Line 14 from the PC motherboard enters the memory module through the socket and follows a metal wiring trace on the memory module substrate until junction A. This input trace has an impedance determined primarily by its width, thickness, and length, and proximity to other wiring traces and layers. Often minimum-width wiring traces are used for all signal traces on the memory module, although power and ground may use wider traces.

The input trace, using the minimum trace width, has a characteristic impedance of about 60 ohms. The branch from junction A to junction B1 also uses the minimum width, and also has an impedance of 60 ohms. The final stubs to the inputs of DRAM chips 21–28 are very short but usually have the same impedance, about 60 ohms.

When the driver on the chip set drives the signal to the opposite state, and initial wave-front or surge of current i travels down line 14 toward junction A. At junction A, the current is split into two halves or roughly i/2 each. At junctions B1, B2, the current is again divided. Since wiring traces have the same impedance before and after junction A, the initial voltage from the initial wave-front traveling along the branch to B1 is half the voltage before junction A, since $V_A=i^*Z_A$ before junction A, and $V_B=i/2^*Z_B$ along each branch after junction A. When impedances $Z_A$ before A and $Z_B$ after A are the same, then $V_B=V_A/2$.

Of course, these are rough estimates, and actual impedances will not be exactly equal, and the voltage drop-off after junction A may not be exactly 50%. However, the general idea is that the instantaneous voltage of the initial wave-front drops off after junction A when the same-width and same-thickness wiring traces are used before and after the junction.

Further voltage reduction of that initial wave-front can occur at junctions B1, B2, and further reduce the initial voltage applied to the inputs to DRAM chips 21–28. Reflections can also occur at the junctions and from the chip inputs.

As higher frequencies are used, wiring traces act more like transmission lines. Reflections from junctions and chip inputs travel backward along the line after the initial wave-front reaches the junctions or chip inputs. These reflections disturb instantaneous voltages along the line, and take time to settle. This settling time can reduce the practical operating frequency.

Termination circuits such as resistors are normally added to trace endpoints on other systems, but memory modules are so small that such terminations are not practical.

FIG. 3 is a timing diagram showing the problem of voltage drop-off at trace junctions on the memory module. The chip set may drive signal A0 high in response to a rising edge of clock CK. After some delay from the clock, the driver drives an initial wave-front down the trace to the memory module. The voltage at the chip inputs C2, C3, â□ is shown. Voltage drop-offs at junctions A and B1 reduce the voltage of the initial wave-front, and cause reflections that reduce the voltage at C1, C2, such as knee 32 caused by junction A, and knee 34, caused by junction B1.

The delay until the voltage at DRAM inputs C2, C3 rises above the logic threshold is the propagation delay. This propagation delay is extended due to knee 32. The logic threshold of the DRAM input is not reached by the initial wave-front. Instead, the voltage rises above the logic threshold only after one or more reflections return and then boost the voltage above the logic threshold.

What is desired is a memory module with improved wiring-trace design to reduce signal propagation delays. Wiring traces that have an intentional impedance-step are desired to reduce junction reflections and improve speed. It is desired to reach the DRAM logic threshold voltage on the initial wave-front to reduce delays due to transmission-line effects.

BRIEF DESCRIPTION OF DRAWINGS

FIG. 2 highlights a reflection problem caused by trace junctions.

FIG. 3 is a timing diagram showing the problem of voltage drop-off at trace junctions on the memory module.

DETAILED DESCRIPTION

The present invention relates to an improvement in memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
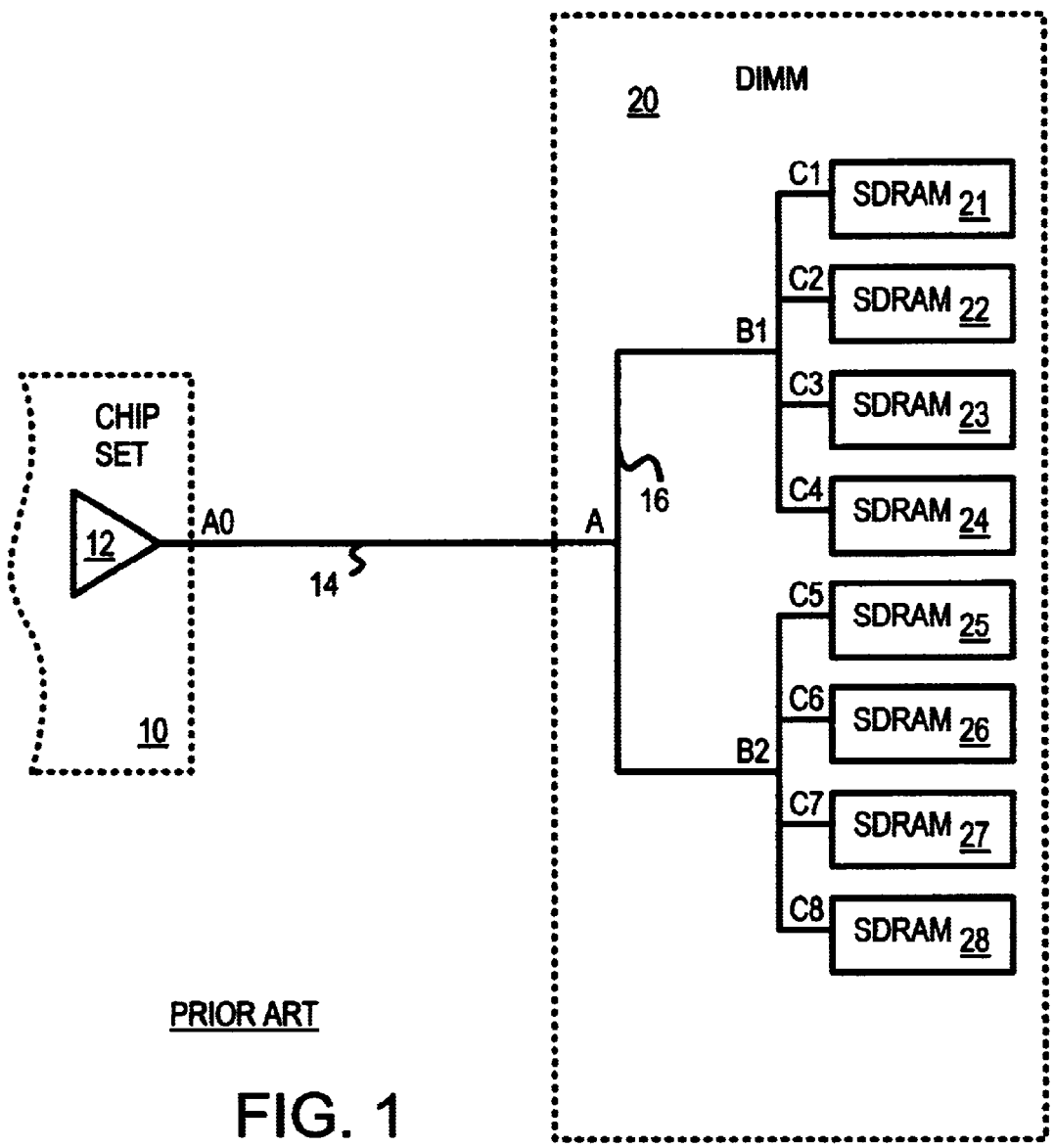
FIG. 1 shows a signal trace on a typical memory module.
Figure 4:
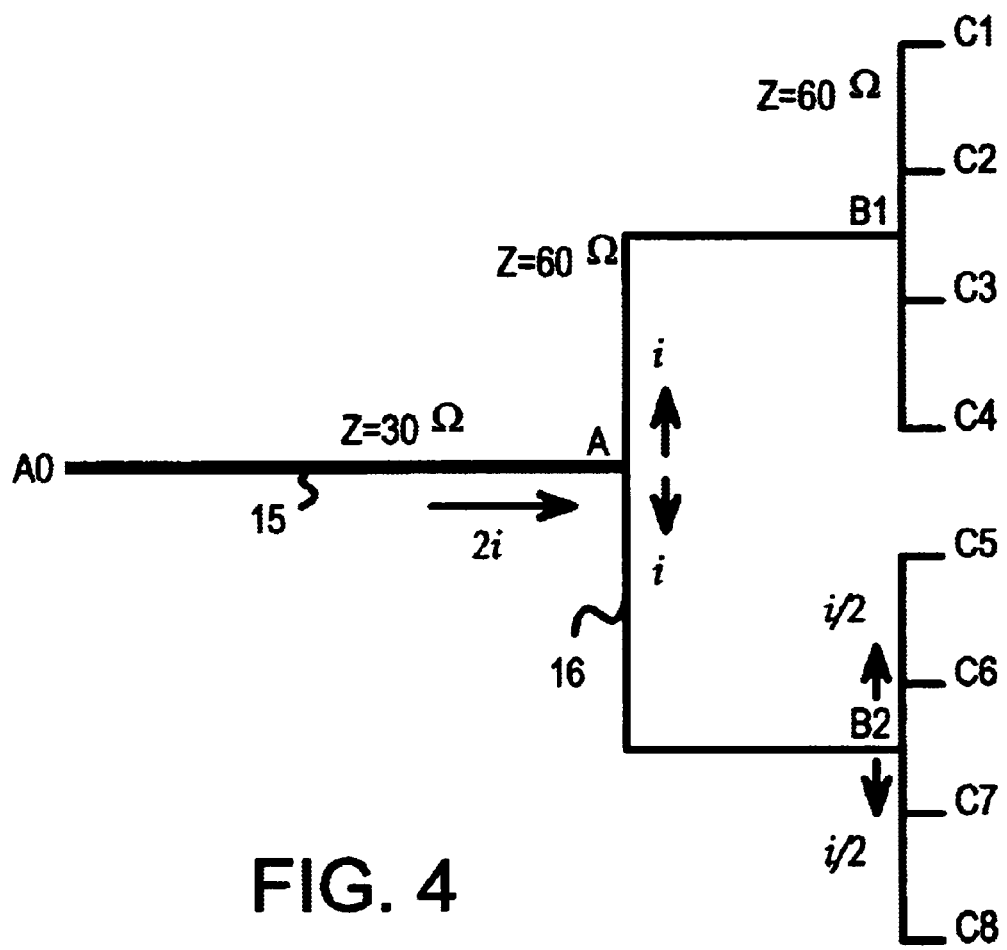
FIG. 4 highlights the concept of impedance matching at a wiring-trace junction on a memory module.

FIG. 4 highlights the concept of impedance matching at a wiring-trace junction on a memory module. An incoming signal, such as address A0 from a memory controller chip set, passes through the memory module socket and enters the memory module on input line 15. At junction A, input line 15 splits into two branches (lines 16) to secondary junctions B1, B2. Then the wiring traces split again to reach inputs C1–C8 of to DRAM chips 21–28.

The impedance mis-match at junction A is eliminated by adjusting the input impedance to match the output impedance. The impedance of input line 15 is adjusted to match the combination of the impedances of the two branches of lines 16. Lines 16 are typically minimum-width and minimum-thickness wiring traces on or within the memory module substrate and have a characteristic impedance of 60 ohms each. The combination of the two parallel 60-ohm impedances is 30 ohms (The equivalent $Z=1/[(1/Z1)+(1/Z2)]$ where Z1 and Z2 are in parallel). Thus input line 15 is adjusted to have a 30-ohm impedance. This can be done by doubling the width of the wiring trace for input line 15 relative to the width of lines 16.

By matching the input impedance of line 15 to the combined output impedance of lines 16, impedance mis-match at junction A can be avoided. This improves signal integrity.

A larger driver may be needed on the chip set or on the memory module to drive the reduced impedance of input line 15. With the larger driver driving input line 15 with a reduced impedance of 30 ohms, the current delivered to junction A from input line 15 by the initial wave-front is double the current delivered in FIG. 2 by the 60-ohm line 14.

This initial current 2i into junction A is split into two branches of lines 16, each receiving current i, about half the current entering junction A. The initial current in each branch is again split at junctions B1 and B2 into currents of i/2. This is double the i/4 current delivered in FIG. 2.

The doubled current delivered to the DRAM inputs produces a higher initial voltage rise at the inputs C1–C8 of DRAM chips 21–28. This higher initial voltage rise can be above the logic threshold (such as 1.2 volts, or Vcc/2, or another intermediate value), allowing the switching point voltage to be reached on the initial wave-front before any knees due to reflections occur. Then the propagation time is not delayed due to settling time for reflections and ringing. The first reflection from junction A is eliminated when the impedance matching is exact, or reduced significantly even when the input and output impedances are not precisely matched.

The actual impedances of lines 16 may not be 60 ohm, but may be some other value. Likewise, input line 15 may not be exactly 30-ohm impedance, and there may be some impedance mis-match even when input line 15 is double the width of output lines 16, such as a mis-match of 10% or even 20%. Thus rather than doubling the width of input line 15, some other ratio may be needed to match the output impedance when lengths differ. However, the concepts of impedance matching at wiring junctions are best illustrated with this simplified example.

The length of each branch of lines 16 is 2.15 inches in one embodiment, and the length of the distribution lines after point B1, and after point B2, is about half, at 1 inch or so. Significant reflections can occur at junctions A and B1, B2.

The lengths of final stubs from the line after point B1 to DRAM inputs C1, C2 . . . C4 and from the line after point B2 to DRAM inputs C5, C6 . . . C8 are only 0.25 inch or so. Thus the reflections caused by the final stubs to the DRAM inputs is much less than the reflections caused by junctions A, B1, and B2.

Figure 5:
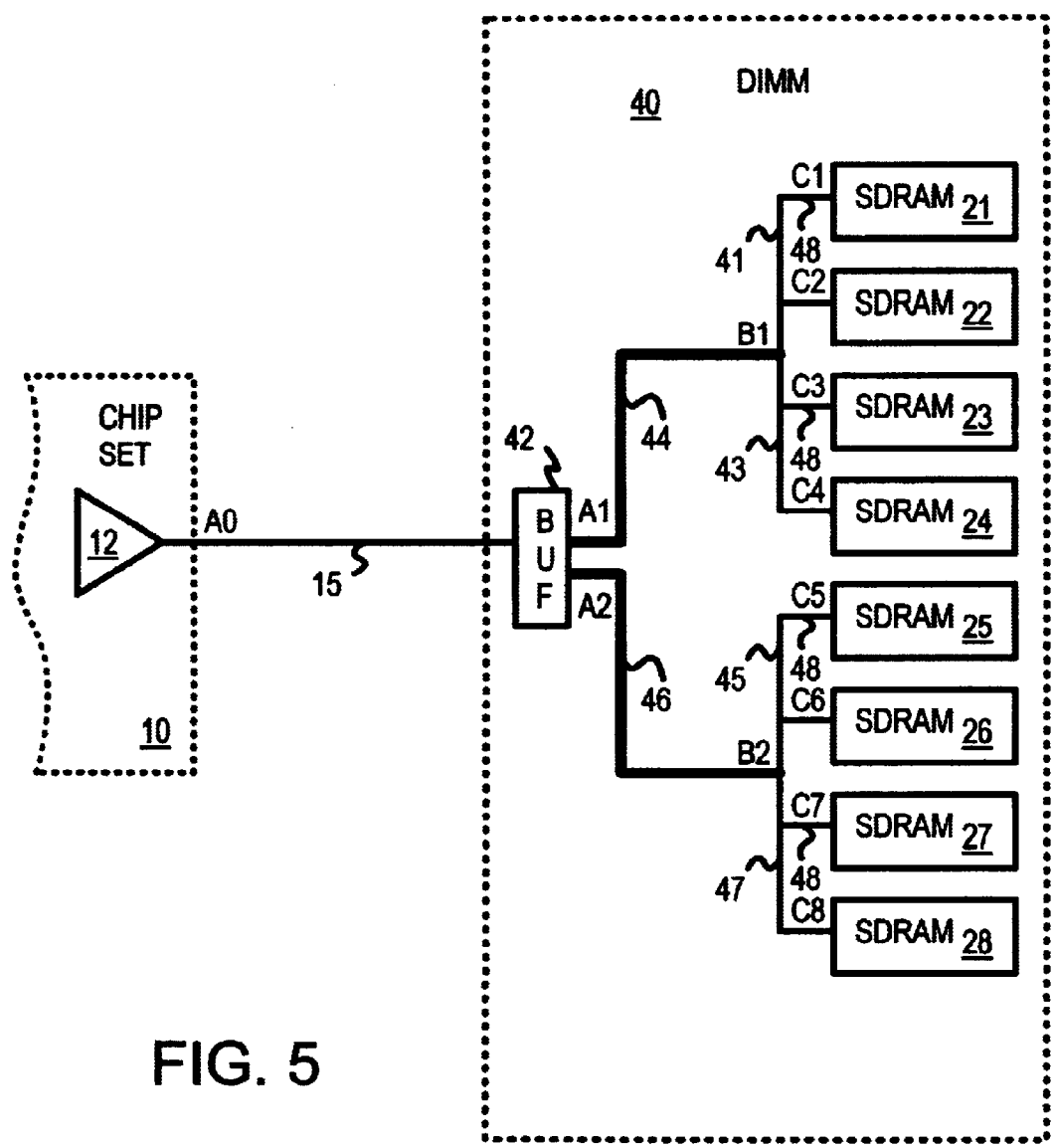
FIG. 5 shows a buffered memory module with impedance matching at wiring junctions.

FIG. 5 shows a buffered memory module with impedance matching at wiring junctions. Doubling the driver strength of drivers on the chip set or PC motherboard may not be practical since the memory modules may be manufactured for use in a wide variety of PC motherboards. Instead, buffer 42 is added to the memory module to locally buffer signals from the PC motherboard.

Driver 12 on chip set 10 on the PC motherboard is a standard driver that drives line 15 to the memory module sockets. The input loads from DRAM chips 21–28 are disconnected from line 15 by buffer 42, significantly reducing the capacitive load on input line 15. Driver 12 can more quickly drive line 15 with the removal of the loads from DRAM chips 21–28. This speed up of line 15 on the PC motherboard can offset the added propagation delay through buffer 42. Impedance matching at junctions after buffer 42 on DIMM memory module 40 can also offset the added propagation delay of buffer 42 so that the overall propagation delay from chip set 10 to inputs C1–C8 of DRAM chips 21–28 is less that without buffer 42.

Buffer 42 is mounted on the substrate of memory module 40, and receives the address, control, or other signal from line 15 through the memory module socket and after a short trace on memory module 40. Buffer 42 splits this signal into two separate branches at outputs A1, A2, which drive lines 44, 46, respectively, to junctions B1, B2. Trace-wiring junction A is replaced by buffer 42, eliminating the reflection from junction A.

The wiring-trace from output A1 of buffer 42 to junction B1, line 44, is enlarged to reduce its impedance, such as by using a double-width trace line. At junction B1, lines 41, 43 branch off, with line 41 connecting to DRAM inputs C1, C2 and line 43 connecting to DRAM inputs C3, C4 through short stubs. These stubs are so short in length that they produce minor reflections. However, a reflection could occur at junction B1, since lines 41, 43 are longer, about half the length of line 44.

The reflection at junction B1 is eliminated or reduced by matching trace impedances. The combined output impedance of lines 41, 43 is matched to the input impedance of line 44. For example, the width of line 44 can be increased to double the minimum width of lines 41, 43, or some other width ratio can be used that takes into account the lengths and overall impedances of lines 41, 43 relative to the length and overall impedance of line 44.

Likewise, the reflection at junction B2 is eliminated or reduced by increasing the width of line 46 to match the combined impedance of lines 45, 47. Reflections from stubs 48 are minor, since they are short, typically only a quarter-inch, while lines 45, 47 are much longer, perhaps an inch each.

Figure 6:
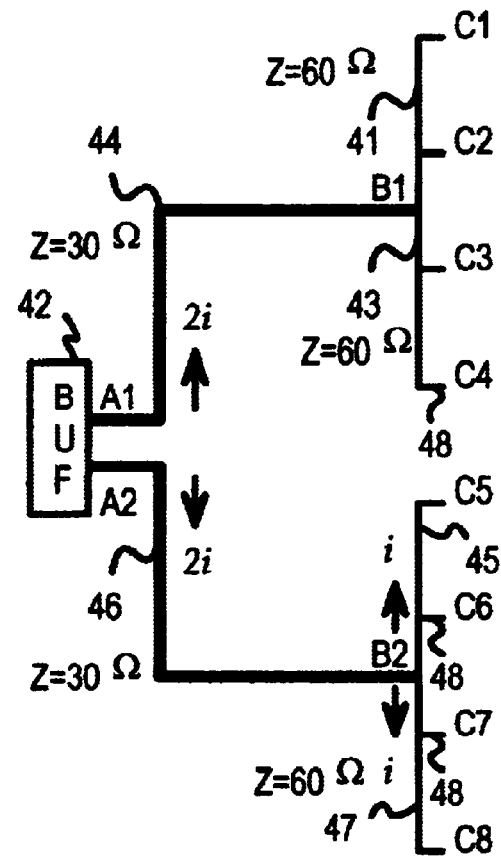
FIG. 6 details wiring-trace impedance matching on an input-buffered memory modules.

FIG. 6 details wiring-trace impedance matching on an input-buffered memory modules. Buffer 42 splits a signal from the PC motherboard into two outputs A1, A2. Buffer 42 can have a high drive, such as to deliver a current of 2$i$ to each output A1, A2. Thus a current of 2$i$ is delivered down line 44 to junction B1, and another, separate current of 2$i$ is delivered down line 46 to junction B2.

The current of 2$i$ into junction B1 is split among lines 41, 43, each receiving about a current i. Likewise, the current of 2$i$ into junction B2 is split among lines 45, 47, each receiving about a current i. Since the stubs C2, C3 are very short, the reflection from the DRAM inputs at C2 and C3 are very minimal. As a result, the current is sufficient to reach above the logic threshold voltage at the DRAM inputs of C1 and C4 on the first wave-front.

At junction B1, the input trace width of line 44 is increased to reduce trace impedance to about 30 ohms, while the impedances of output lines 41, 43 is about 60 ohms each. Minimum-width traces are used for lines 41, 43, while a wider trace, such as a double-width trace, is used for line 44. The input impedance of 30 ohms matches the combined impedance of 30 ohms for the parallel combination of lines 41, 43. Thus the reflection at junction B1 is reduced or eliminated.

Likewise, at junction B2, the input trace width of line 46 is increased to reduce trace impedance to about 30 ohms, while the impedances of output lines 45, 47 is about 60 ohms each. Minimum-width traces are used for lines 45, 47, while a wider trace, such as a double-width trace, is used for line 46. The input impedance of 30 ohms matches the combined impedance of 30 ohms for the parallel combination of lines 45, 47. Thus the reflection at junction B2 is reduced or eliminated. Since the stubs C6, C7 are very short, the reflection from the DRAM inputs of C6 and C7 are very minimal. As a result, the current is sufficient to reach above the logic threshold voltage at the DRAM inputs of C5 and C8 on the first wave-front.

Figure 7:
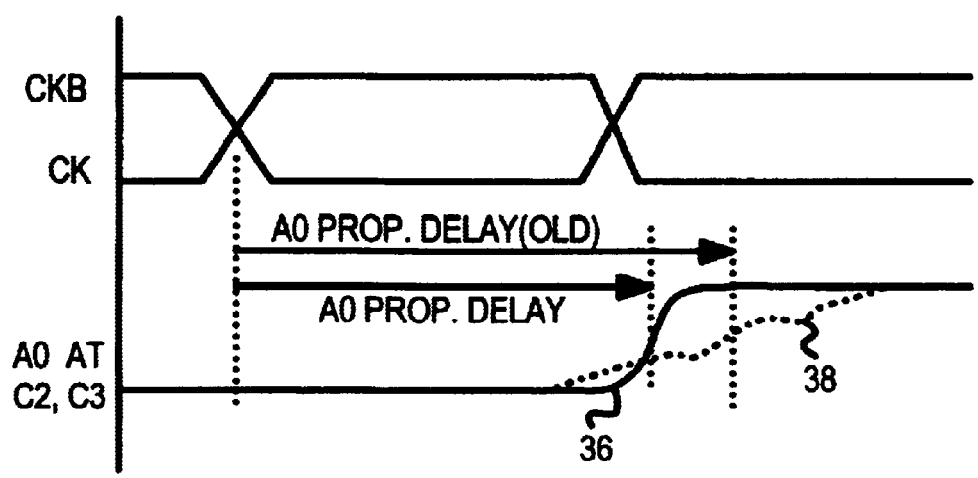
FIG. 7 is a waveform diagram showing improved signal propagation to DRAM inputs when input-buffering and trace-impedance matching are used.

FIG. 7 is a waveform diagram showing improved signal propagation to DRAM inputs when input-buffering and trace-impedance matching are used. The problem of voltage drop-off at trace junctions on the memory module is reduced.

The chip set may drive signal A0 high in response to a rising edge of clock CK. After some delay from the clock, the driver drives an initial wave-front down the trace to the memory module. The voltage at the chip inputs C2, C3, â is shown for the module of FIG. 5 in curve 36, and for the prior-art module of FIG. 2 in curve 38.

Voltage drop-offs at junctions A and B1 are eliminated or reduced, since buffer 42 eliminated the A junction, and trace-impedance matching at junction B1 eliminates or reduced its reflection. A monotonic rising waveform without large knees occurs on curve 36 with a faster slew rate due to the additional current provided by buffer 42 and the reduced loading on the chip-set driver on the PC motherboard. Since the initial wave-front is sufficient to drive the DRAM inputs over the logic threshold voltage, the DRAM inputs switch earlier, before any reflections occur. Settling time by reflections does not have to be added to the propagation delay, reducing the propagation delay for improved curve 36 relative to prior-art curve 38.

The initial wave-front may be delayed by buffer 42, causing the beginning of the voltage rise for curve 36 to be later than for curve 38, but the more rapid slew rate causes curve 36 to reach above the logic threshold, such as Vcc/2, earlier. An output of chip set 10 needs to drive two or more memory modules. In this case, each output of chip set 10 is very heavily loaded, and slow. The use of buffer 42 speeds up propagation time by drastically reducing the loads of chip set address/control signal outputs driving multiple memory modules. This is a benefit of the buffered module.

A combination of trace-input matching and input buffering can improve overall propagation delay, especially at higher frequencies of operation where transmission-line effects are problematic. Signal integrity is also improved.

Figure 8:
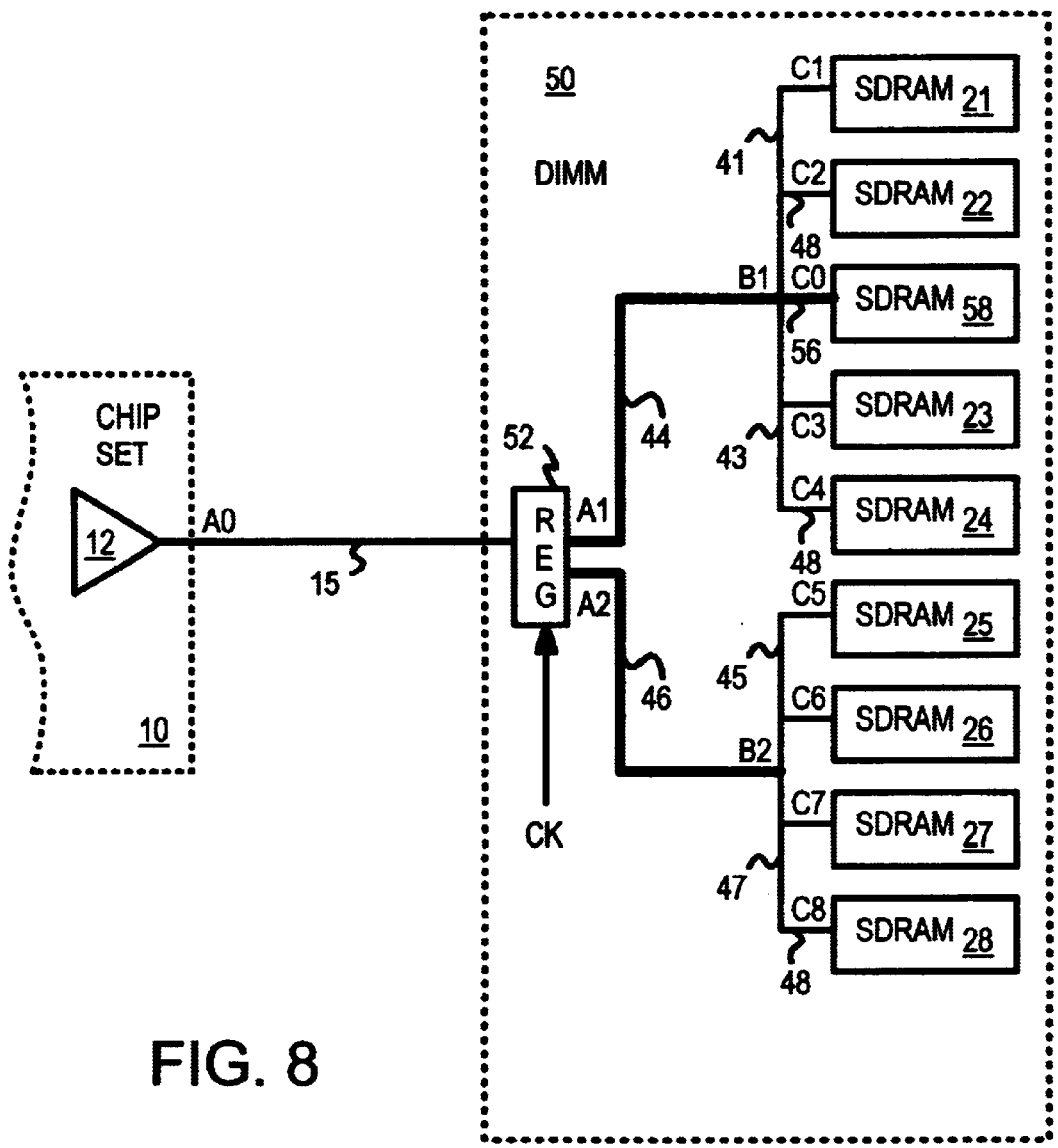
FIG. 8 shows an alternate embodiment using a registered buffer and an extra DRAM chip.

FIG. 8 shows an alternate embodiment using a registered buffer and an extra DRAM chip. Register 52 can be used in place of input buffer 42 of FIG. 5. Register 52 receives a clock and latches the input signal on line 15 from the PC motherboard and driver 12. The clock can be the clock input to synchronous DRAM chips 21–28, 58. Register 52 delays output of the signal until the next clock edge.

Some memory modules may include an extra bit for parity or error-correction purposes. Ninth DRAM chip 58 is an additional DRAM chip. Input C0 to DRAM chip 58 connects to junction B1 through line 56. Line 56 is an extension of line 44 and has the same increased width as line 44. Since line 56 is short, only 0.25 inch or less, it can be ignored compared to inch-long lines 41, 43 and 2-inch line 44. Likewise stubs 48 are short and can be ignored when calculating impedance matching at junction B1.

Impedance matching at junction B1 is thus similar to that described earlier for junction B1 of FIG. 5. The width of line 44 and its extension line 56, can be increased relative to the width of lines 41, 43. The width of lines 44, 56 can be double a minimum width of lines 41, 43 and stubs 48, or some other ratio of widths can be used to best match trace impedances.

Alternate Embodiments

Several other embodiments are contemplated by the inventor. For example the trace impedance of line segments 41, 43, 45, and 47 may be increased, such as to 120 ohms. The impedance of line segments 44 and 46 then remain the same 60 ohms. The impedance of segment 14 may be 30 ohms. Then no buffer 42 is needed. In this alternative the board may be more complex to fabricate, and chip-set driver 12 needs to drive harder. The thickness of input line 15 or lines 44, 46 could be increased rather the width to reduce impedance, but this may be more complex to fabricate. More precise impedance matching can be done by more exact calculations or simulation of line geometries of actual memory module layouts. Measurements could be made of memory modules, or several prototype memory modules could be manufactured with slightly differing line widths and impedances and tested to determine empirically the best line widths for impedance matching.

Traces could be somewhat asymmetric. For example, one distribution trace from junction B1 could connect to more DRAM chips than the other distribution trace. The junction B1 may not be exactly in the middle of the group of the upper 4 DRAM chips. Different numbers of DRAM chips could be mounted on the module, such as 16 or 32 or 36 or some other number. DRAM chips may be mounted on both sides of the memory module, and additional distribution lines, junctions, and outputs from the buffer could be used, such as dividing each input signal into four outputs of the buffer.

Buffer 42 (FIG. 5) or register 52 (FIG. 8) can have one input pin from input line 15, or line 15 can be connected to two input pins of buffer 42 (or register 52) using short trace stubs. The short length of theses stubs minimizes any possible reflections on line 15 if two pins to buffer 42 (register 52) are used. Termination (series, parallel, or other) of input line 15 could be provided on the memory module. Buffer or register outputs can be specially designed to drive the memory module traces, such as by skewing pull-up and pull-down drive strengths. Other buffering chips such as transparent latches could be substituted for buffer 42 or register 52. Memory modules such as double-data-rate (DDR) or other formats may be used.

One buffer or register chip could receive many separate signals, such as 10 or more address signals, or RAS, CAS, write, strobe and other control signals. Multiple buffer or register chips could be used. Lines may be traces in a metal layer on one of the surfaces of the memory module substrate, or may be on a metal layer within the substrate, or may include a combination of layers including metalized vias connecting layers.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. Â§ 1.72(b). Any advantages and benefits described may not apply to all embodiments of the invention. When the word "means" is recited in a claim element, Applicant intends for the claim element to fall under 35 USC Â§ 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC Â§112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A memory module comprising:
    a substrate having wiring traces formed thereon, the substrate being a size for inserting into a memory module socket to receive input signals;
    a plurality of memory chips for storing data, including a first plurality of the memory chips and a second plurality of the memory chips;
    an input buffer, receiving an input signal from the memory module socket, the input buffer producing two outputs for the input signal, a first output and a second output;
    a first enlarged trace, between the first output and a first trace-junction, driven by the input buffer, the first enlarged trace having an enlarged cross-section greater than a minimum cross-section for the wiring traces on the memory module;
    a first distribution trace and a second distribution trace, each coupled to the first trace-junction, for electrically connecting to inputs to the first plurality of the memory chips;
    a second enlarged trace, between the second output and a second trace-junction, driven by the input buffer, the second enlarged trace having the enlarged cross-section greater than the minimum cross-section for the wiring traces on the memory module; and
    a third distribution trace and a fourth distribution trace, each coupled to the second trace-junction, for electrically connecting to inputs to the second plurality of the memory chips;
    wherein the first, second, third, and fourth distribution traces each has a cross-section substantially smaller than the enlarged cross-section of the first enlarged trace,
    whereby different cross-sections of wiring traces are used for inputs and outputs of the first trace-junction.

2. The memory module of claim 1 wherein the first distribution trace and the second distribution trace have a minimum cross-section that is substantially smaller than the enlarged cross-section of the first enlarged trace;
    wherein the third distribution trace and the fourth distribution trace have the minimum cross-section that is substantially smaller than the enlarged cross-section of the second enlarged trace,
    whereby minimum cross-sections are used for distribution traces.

3. The memory module of claim 2 wherein the enlarged cross-section of the first enlarged trace has an area that is about double an area of the minimum cross-section.

4. The memory module of claim 2 wherein the first enlarged trace and the first and second distribution traces have substantially a same thickness;
    wherein the enlarged cross-section of the first enlarged trace has a width that is greater than a minimum width of the minimum cross-section.

5. The memory module of claim 4 wherein the enlarged cross-section of the first enlarged trace has a width that is about double the minimum width of the minimum cross-section.

6. The memory module of claim 2 wherein the enlarged cross-section of the first enlarged trace has a width that is greater than a minimum width of the minimum cross-section by an impedance ratio, the impedance ratio being substantially equal to a ratio of a first impedance of the first distribution trace to an impedance of the first enlarged trace,
    whereby widths are ratioed by a ratio of impedances of the first enlarged trace to the impedance of the first distribution trace.

7. The memory module of claim 2 wherein the first enlarged trace has an impedance substantially equal to a combined impedance of the first and second distribution traces;

wherein the combined impedance is an equivalent impedance of a parallel connection of the first and second distribution traces, whereby trace sizes are adjusted to match impedances at the first trace-junction.

8. The memory module of claim 2 wherein the first distribution trace and the second distribution trace further comprise:

first stub traces to the inputs to the first plurality of the memory chips;

the first stub traces having a substantially smaller length than the first or second distribution traces.

9. The memory module of claim 2 wherein the memory chips are dynamic-random-access memory (DRAM) chips.

10. The memory module of claim 9 wherein the memory chips are synchronous dynamic-random-access memory (SDRAM) chips that receive a clock from the memory module socket.

11. The memory module of claim 10 wherein the input buffer is registered, the input buffer receiving the clock and propagating the input signal in response to the clock.

12. The memory module of claim 2 further comprising:

a plurality of input buffers, each connecting a different input signal to different first and second enlarged traces to different first and second trace-junctions, for carrying a plurality of input signals to the plurality of memory chips;

wherein the plurality of input signals include address signals and control signals, whereby each input signal is split into two enlarged traces.

13. An impedance-matched memory module comprising:

a printed-circuit board (PCB) substrate having contact pads for inserting into a memory module socket to receive input signals that include address signals and control signals for controlling memory chips;

a buffer, mounted on the PCB substrate, having a plurality of input buffers that each receive one of the input signals but drive a pair of outputs including a first output and a second output;

a plurality of enlarged traces on the PCB substrate that each have a width larger than a minimum width;

a plurality of minimum-width traces on the PCB substrate that each have the minimum width;

a plurality of memory chips mounted on the PCB substrate, controlled by he address and control signals; and a plurality of junctions, each having an input trace that is one of the plurality of enlarged traces that is connected to an output of the buffer, each having at least two output traces, each output trace being one of the plurality of minimum-width traces, each output trace connecting to one or more of the memory chips, whereby junctions have enlarged-trace inputs and minimum-width output traces.

14. The impedance-matched memory module of claim 13 wherein each junction is impedance matched, wherein an input impedance of the input trace matches half of an impedance of an output trace for that junction, wherein the input impedance substantially matches an equivalent output impedance that is a combination of impedances in parallel of the at least two output traces for that junction, whereby junctions are impedance-matched.

15. The impedance-matched memory module of claim 14 wherein the output traces each connect to a plurality of stub traces that connect to inputs to at least two of the memory chips;

wherein the stub traces are in the plurality of minimum-width traces.

16. The impedance-matched memory module of claim 15 further comprising:

an enlarged stub, having a width larger than a minimum width, for connecting from a four-way junction to one of the memory chips;

wherein the four-way junction has an input trace being one of the plurality of enlarged traces and having two output traces that are each in the plurality of minimum-width traces and an extra output trace that is the enlarged stub.

17. The impedance-matched memory module of claim 16 wherein the buffer receives a clock signal, wherein at least some of the input buffers are registered input buffers that propagate an input signal to the pair of outputs in response to the clock, whereby input signals are clocked by the buffer.

18. A buffered memory module comprising:

a plurality of memory chips for storing data;

substrate means for supporting the memory chips and having wiring traces formed thereon connected to the memory chips and to contact means, formed on the substrate means, for connecting to external signals when the buffered memory module is inserted into a memory module socket;

splitting buffer means, mounted on the substrate means, for receiving the external signals and driving two enlarged output lines for each of the external signals to replicate the external signal onto the two enlarged output lines; and a plurality of matched-impedance junction means for matching input and output trace impedances, each matched-impedance junction means receiving one of the two enlarged output lines as an input, and outputting a first distribution line and a second distribution line, the first distribution line connecting to inputs of at least two of the plurality of memory chips, and the second distribution line connecting to inputs of at least two of the plurality of memory chips;

wherein an input impedance of an output line connected to a matched-impedance junction means is substantially equal to an equivalent impedance that is a combined impedance of the first distribution line and the second distribution line;

whereby trace impedances are matched at the matched-impedance junction means to minimize impedance-mis-match reflections.

19. The buffered memory module of claim 18 wherein the input impedance of the output line connected to a matched-impedance junction means is substantially half of an impedance of the first distribution line or half of an impedance of the second distribution line, whereby impedances of the output lines are double impedances of distribution lines.

20. The buffered memory module of claim 19 wherein the output lines between the splitting buffer means and the plurality of matched-impedance junction means each have widths about double a minimum width;

wherein the first and second distribution lines have the minimum width.

* * * * *